United States Patent [19]

Yamamoto et al.

[11] Patent Number: 4,901,669

[45] Date of Patent: Feb. 20, 1990

[54] METHOD AND APPARATUS FOR FORMING THIN FILM

[75] Inventors: Takashi Yamamoto; Shozo Kaneko; Tadashi Gengo; Joji Ichinari, all of Nagasaki; Hiroshi Fujiyama, Nagasaki; Yoshio Kayumi; Masayoshi Murata, both of Nagasaki, all of Japan

[73] Assignee: Mitsubishi Jukogyo Kabushiki Kaisha, Tokyo, Japan

[21] Appl. No.: 47,328

[22] Filed: May 8, 1987

[30] Foreign Application Priority Data

| May 9, 1986 | [JP] | Japan | 61-106313 |
| May 9, 1986 | [JP] | Japan | 61-106314 |
| May 9, 1986 | [JP] | Japan | 61-106315 |
| Jul. 8, 1986 | [JP] | Japan | 61-160217 |
| Aug. 5, 1986 | [JP] | Japan | 61-183902 |

[51] Int. Cl.⁴ ............................................. C23C 16/50
[52] U.S. Cl. ..................................... 118/723; 427/39; 427/47
[58] Field of Search ............... 118/723; 427/47, 39

[56] References Cited

U.S. PATENT DOCUMENTS 4,825,806 5/1989 Tawada ................. 118/723

FOREIGN PATENT DOCUMENTS 57-47710 3/1982 Japan.
58-42126 5/1982 Japan.
59-65436 4/1984 Japan.
60-128613 7/1985 Japan ......................... 118/723

OTHER PUBLICATIONS

Design Parameters of Large-Scale Horizontal Plasma Furnace, pp. 183–186.

Primary Examiner—Richard Bueker
Attorney, Agent, or Firm—Birch, Stewart, Kolasch & Birch

[57] ABSTRACT

The present invention is directed to a method for forming a thin film on a substrate by the use of a glow discharge plasma which comprises generating a magnetic field in a direction which crosses an electric field for discharge at right angles and fluctuating the magnetic field. The present invention is also directed to an apparatus for practicing the above method, which apparatus is composed of a reaction vessel, means for reducing the pressure in the reaction vessel and means for introducing the feed of reaction gases to the reaction vessel, electrodes for discharge disposed face to face in the reaction vessel, a power source from which a voltage for causing a glow discharge is fed to the electrodes for discharge, a coil surrounding the electrodes for discharge, for generating a magnetic field in a direction crossing at right angles to an electric field generated between the electrodes for discharge, and an AC power source for generating a magnetic field fed to the coil, whereby a thin film is formed on a base plate supported outside the range of the discharge electric field and in parallel with the direction of the electric field.

22 Claims, 4 Drawing Sheets

METHOD AND APPARATUS FOR FORMING THIN FILM

FIELD OF THE INVENTION AND RELATED ART STATEMENT

The present invention relates to a method and an apparatus for forming thin films which can be used for various electronic devices such as solar cells, fuel cells, thin-film semiconductors, electrophotographic sensors and photosensors.

FIG. 7 shows an apparatus for forming a semiconductor thin film which has been heretofore used, and techniques regarding this apparatus are known and disclosed in, for example, Japanese Patent Provisional Publication No. 04771/1982 elsewhere.

In FIG. 7, a pair of electrodes 102, 103 for producing a dishcarge space are disposed face to face in a vertical direction in an airtight reaction vessel 101 and are further electrically connected to a high-frequency power source 104. Around the outer periphery of the reaction vessel 101, a coil 105 is horizontally disposed which generates a magnetic field in parallel with the direction of an electric field in the discharge space and which is electrically connected to an AC power source 106. An exhaust vent 107 leads to a vacuum pump not shown, and a reaction gas guide pipe 108 leads to bombs of a monosilane ($SiH_4$) gas and a hydrogen gas ($H_2$). Reference numeral 109 is a heater for heating a base plate 110.

Now, the operation of the apparatus shown in FIG. 7 will be described.

The base plate 110 is put on the one electrode 103, and a pressure in the reaction vessel 101 is then reduced to a level of about 1 mmHg. While a mixed gas of the monosilane and hydrogen gases is fed into the reaction vessel 101 through a reaction gas guide pipe 108, a high-frequency voltage of 13.5 MHz is applied between the pair of electrodes 102, 103.

On the other hand, a commercial AC voltage of 50 or 60 Hz is applied to the coil 105, so that a magnetic field of about 100 gauss is generated between the pair of electrodes 102 and 103. For this period of time, the base plate 110 is heated up to about 300° C. by means of the heater 109.

The gases of the monosilane gas and the like which have been introduced into the reaction vessel 101 through the reaction gas guide pipe 108 are decomposed in the discharge space between the pair of electrodes 102 and 103. While the gas is stirred with the fluctuating magnetic field generated by the coil 105, gaseous components are deposited on the surface of the base plate 110, thereby forming an amorphous thin film thereon.

Further, FIG. 8 shows another method for forming a thin film which has been heretofore used.

In this method, there are utilized, for example, zirconium chloride ($ZrCl_4$), yttrium chloride ($YCl_3$) and water vapor ($H_2O$) in order to form a stabilized zirconia film 213 on the base plate 216.

Now, the operation of this conventional method will be described.

In an evaporator 202 are placed solid zirconium chloride 204 and yttrium chloride 205, and the evaporator 202 is heated up to 800 to 1,000° C. by means of a heater 203 in order to generate a metallic vapor. The latter is then forwarded to a reaction vessel 201 via a first pipe 210 together with an argon gas 209 coming through a carrier gas guide pipe 206. On the other hand, a water vapor 212 is generated by a water vapor generator not shown and is then injected into a porous base plate 216 from the back surface thereof through a second pipe 211. The water vapor 212 further passes through the base plate 216 and reaches the upper face thereof.

In this case, the side faces of the base plate 216 are sealed in order that the water vapor 212 cannot pass therethrough.

On the upper face of the base plate 216, the vapors of the zirconium chloride 204 and the yttrium chloride 205 forwarded by the carrier gas are mixed with the water vapor 212, and chemical reactions take place which can be represented by the following formulae:

$$ZrCl_4 + 2H_2O \rightarrow ZrO_2 + 4HCl$$

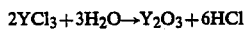

$$2YCl_3 + 3H_2O \rightarrow Y_2O_3 + 6HCl$$

These reactions produce zirconium oxide ($ZrO_2$ zirconia), yttrium oxide ($Y_2O_3$) and a chlorine gas (HCl).

As zirconium oxide and yttrium oxide are deposited on the base plate 216, it is getting difficult for the water vapor 212 to pass through the base plate 216, but since an oxygen ion $O^{2-}$ transfers, the following reactions take place successively:

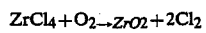

$$ZrCl_4 + O_2 \rightarrow ZrO_2 + 2Cl_2$$

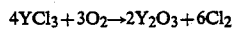

$$4YCl_3 + 3O_2 \rightarrow 2Y_2O_3 + 6Cl_2$$

In this way, a stabilized zirconia $(ZrO_2)0.9$-$1(Y_2O_3)0.09$ film 213 is formed on the base plate 216.

A residual gas and products (hydrochloric acid and chlorine) in the reaction vessel 201 are discharged through a third pipe 217 by means of a suction pump 218.

In the apparatus shown in FIG. 7, the fluctuating magnetic field is generated by the coil 105 in parallel with the direction of the electric field generated between the pair of electrodes 102, 103, and therefore ions such as silicon and the like which are present in the discharge space between the pair of electrodes 102 and 103 are stirred, so that a relatively uniform amorphous thin film is formed on the base plate 110.

However, this apparatus has the following drawbacks:

(1) The base plate 110 is located on the electrode 103 and therefore it lies in the discharge space between the pair of electrodes 102 and 103. Accordingly, the base plate 110 is attacked by the ions having basically high energy levels.

That is, since an electric field E is present between the pair of electrodes 102 and 103, a Coulomb force $F_1 = qE$ acts on the ions having a charge q, and these ions directly attack the base plate 110. As a result, the amorphous thin film which is now being formed is damaged.

(2) Since the direction of a fluctuating magnetic field B generated by the coil 105 is in parallel with the electric field E generated in the charge space, the ions and electrons in the discharge space are revolved by the Larmor motion. However, the stirring function of this revolution is not so great, and thus an extremely large electric power is required for the stirring.

(3) Since the base plate 110 is put on either electrode, the size of the base place 110 which can be treated at one time is limited. In other words, the amorphous thin film cannot be formed on the base plate having a greater area than the electrode.

(4) Since the base plate 110 is put on either electrode, it is difficult to form the uniform film on the base plate having a large area by means of a DC discharge and a low-frequency discharge in which secondary electrons must be substantially fed in order to keep up the discharge.

As a consequence, an expensive high-frequency power source is inevitably required.

Furthermore, in the conventional method shown in FIG. 8, the vapors of zirconium chloride and yttrium chloride as well as the water vapor are used to form the stabilized zirconia film. Accordingly, this method has the following drawbacks:

(1) Since hydrochloric acid is produced, auxiliary device members such as the reaction vessel 201 and the gas suction pump 218 must be made from corrosion-resistant glasses. Accordingly, they are inconvenient to handle.

(2) Since it is hard to control a thickness of the stabilized zyrconia film, the formed film is as thick as a level of 100 to 300 $\mu$m, and thus solid electrolytes alone in which a resistance to the movement of an oxygen ion is great can be only manufactured.

OBJECT AND SUMMARY OF THE INVENTION

In the present invention for forming a thin film by the use of a glow discharge plasma, it is characterized that a magnetic field is generated in a direction crossing an electric field for discharge at right angles and is fluctuated.

Further, an apparatus of the present invention for practicing the above method is composed of a reaction vessel, a means permitting the pressure reduction in the reaction vessel and the feed of reaction gases thereto, electrodes for discharge, creating disposed face to face in the reaction vessel, a power source from which a voltage for glow discharge is fed to the electrodes for discharge, a coil surrounding the electrodes, for generating a magnetic field crossing at right angles to the electric field generated between the electrodes for discharge, and an AC power source from which a current for magnetic field generation is fed to the coil, whereby a thin film is formed on a base plate supported outside the range of the discharge electric field space and in parallel with the direction of the electric field.

In the present invention, the magnetic field is generated in the direction crossing at right angles to the electric field for discharge in between the pair of electrodes for generating a glow discharge and plasma.

Charged particles produced by the above constitution are drifted in the direction crossing the electric field at right angles by giving an initial velocity to the particles with the aid of the Choulomb force generated by the discharge electric field and the Lorentz force generated by the magnetic field. When the particles leave the electric field space, the Coulomb force weakens, and the particles fly along a Larmor orbit due to a cyclotron motion based on the Lorentz force.

On the other hand, radical particles which are electrically neutral deviate from the orbit of the group of charged particles and try to fly straight. However, they collide with the charged particles (particularly the ions) which revises their course. In addition, since the magnetic field is fluctuated, the radical particles fly uniformly.

As a consequence, a uniform thin film is formed on the surface of the base plate supported outside the discharge electric field space and in parallel with the electric field.

Other objects, features and benefits of the present invention will be more clarified by the following detailed description and accompanying drawings.

DETAILED DESCRIPTION OF PREFERRED EMBODIMENTS

Figure 1:
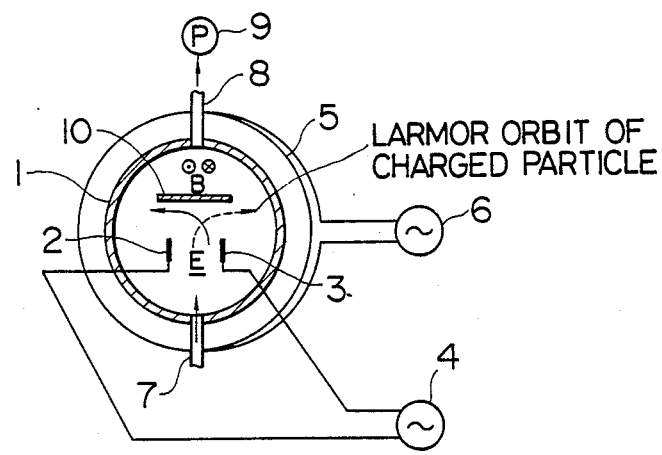
FIGS. 1 to 6 show illustrative cross-sectional views of embodiments of apparatus regarding the present invention.

Now, the present invention will be described in accordance with an apparatus shown in FIG. 1 which is one embodiment of the present invention.

In a reaction vessel 1, a pair of electrodes 2 and 3 are disposed in parallel which generate a glow discharge plasma therein. A low-frequency power source 4 (in place of which, a DC power source or a high-frequency power source may be employed) makes use of, for example, a 60 Hz commercial frequency and is connected to a pair of electrodes 2 and 3. A coil 5 surrounds the reaction vessel 1 and is connected to an AC power source 6. A reaction gas guide pipe 7 leads to bombs not shown and is adapted to guide a mixed gas of monosilane ad argon to the reaction vessel 1 therethrough. An exhaust vent 8 leads to a vacuum pump 9 and is adapted to exhaust a gas in the reaction vessel 1 therefrom.

Now, the operation of the apparatus shown in FIG. 1 will be described.

A base plate 10 is supported by a suitable means in a direction crossing at right angles the surfaces of the pair of electrodes 2, 3 and outside the discharge space defined by the pair of electrodes 2, 3, as shown in FIG. 1. After the reaction vessel 1 has been evacuated by driving a vacuum pump 9, the mixed gas of monosilane and argon is then fed to the reaction vessel 1 through the reaction gas guide pipe 7. The reaction vessel 1 is filled with the mixed gas in order to maintain a pressure therein at 0.05 to 0.5 Torr, and a voltage is then applied to the pair of electrodes 2, 3 from the low-frequency power source 4, so that a glow discharge plasma is generated between the pair of electrodes 2, 3.

On the other hand, an AC voltage of, for example, 100 Hz is applied to the coil 5 in order to generate a magnetic field B in a direction crossing at right angles to the electric field E which has been generated between the pair of electrodes 2, 3. In this case, it suffices that a magnetic flux density of the magnetic field B is about 10 gauss.

The monosilane component in the mixed gas fed through the reaction gas guide pipe 7 is decomposed to radical Si by the glow discharge plasma generated between the pair of electrodes 2, 3, and the radical Si is deposited on the surface of the base plate 10 to form a thin film thereon.

At this time, charged particles such as the argon ion and the like are brought into the state of a so-called E×B drift motion between the pair of electrodes 2, 3 by the Coulomb force $F_1 = qE$ based on the electric field E and the Lorentz force $F_2 = q(V \times B)$ wherein the symbol V represents a velocity of the charged particles.

That is, to the charged particles, an initial velocity is given by the E×B drift motion, and the charged particles fly out in a direction crossing at right angles the pair of electrodes 2, 3 and toward the base plate 10. In a zone outside the discharge space, the influence of the electric field generated between the pair of electrodes 2, 3 is small, and therefore the charged particles fly along the Larmor orbit under the effect of a cyclotron motion due to the magnetic field B.

Accordingly, it can be avoided that the charged particles such as argon and the like directly attack the base plate 10.

On the other hand, the radical Si which is electrically neutral is not influenced by the magnetic field B and hence deviates from the orbit of the group of charged particles, so that the radical reaches the base plate 10 and forms an amorphous thin film thereon. At this time, the radical Si collides with the charged particles flying along the in Larmor orbit, and thus files in a more extensive range than the space between the pair of electrodes 2 and 3, with the result that an amorphous thin film having an expanded size is formed thereon. In addition, since the magnetic field B fluctuates, a uniform amorphous thin film can be formed on the surface of the base plate 10.

The pair of electrodes 2, 3 can have an arbitrary length without creating a problem, depending on a size of the reaction vessel 1, and therefore even if the base plate 10 is fairly long, it is possible to form a uniform amorphous thin film thereon.

Figure 2:
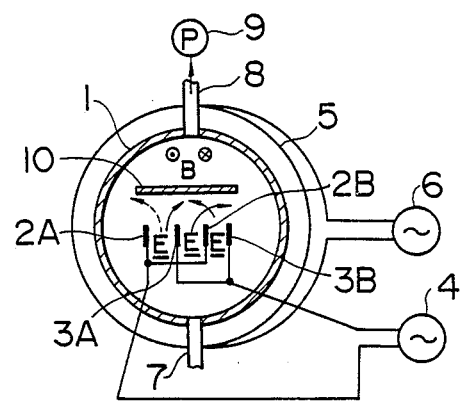

FIG. 2 shows a second embodiment of the present invention.

A point in which the second embodiment is different from the embodiment in FIG. 1 is that two pairs of electrodes, i.e., four electrodes are disposed in the reaction vessel 1. As shown in FIG. 2, the electrodes 2A, 3A, 2B and 3B are arranged so that the two pairs thereof may be alternated, and they are connected to a low-frequency power source 4. In this case, the electric field is produced between the electrodes 2A and 3A as well as between the electrodes 3A and 2B, so that a glow discharge plasma is generated therebetween. The principle of forming the amorphous thin film is identical with that of the previous embodiment, and so its description is omitted.

In the embodiment shown in FIG. 2, the formation of the amorphous thin film can be achieved uniformly on the base plate 10 over its extent approximately corresponding to a width between the electrodes 2A and 3B. Therefore, if the number of electrodes are utilized to correspond to the size of as the reaction vessel 1, the amorphous thin film can be formed on a base plate having a corresponding larger area.

In the embodiments of FIGS. 1 and 2, the coil 5 is disposed outside the reaction vessel 1, but it may be arranged inside the vessel 1.

Further, two base plates 10 may be disposed face to face, with the pair of electrodes 2, 3 being disposed between them. Such a disposition is effective, since the two amorphous thin films, each having a large area can be manufactured simultaneously by one treatment.

Figure 3:
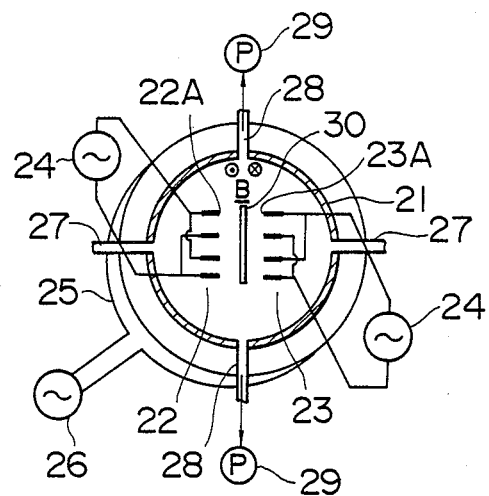

FIG. 3 shows a third embodiment of the present invention.

In this embodiment, a plurality of first electrodes for discharge are disposed in parallel in a reaction vessel, with end portions of the electrodes confronting one surface of a base plate, and another plurality of second electrodes for discharge are disposed in a like manner, with end portions of the electrodes confronting the other surface of the base plate. A plurality of reaction gas guide pipes and exhaust vents are provided in the wall of the reaction vessel.

That is, reference numeral 21 is a reaction vessel, and numerals 22 and 23 are first and second electrodes. These electrodes in each group are disposed in parallel and are alternately connected to a low-frequency power source 24. Reference element 25 is a coil, numeral 26 is an AC power source, 27 is a reaction gas guide pipe, 28 is an exhaust vent, 29 is a vacuum pump and 30 is a base plate.

The electrodes 22, 23 are supported in the reaction vessel 21 by a suitable means so that each of the end portions 22A, 23A thereof may confront either surface of the base plate 30, so that spaces between the end portions of the electrodes and both the surfaces of the base plate may be uniform.

The other constituion and the principle of forming the thin film are identical with those of the above embodiments.

In this embodiment, since the base plate 30 is disposed vertically, the surfaces of the base plate 30 are seldom contaminated with amorphous pieces which drop from the inside surface of the reaction vessel 21 and the surfaces of the electrodes 22, 23.

Figure 4:
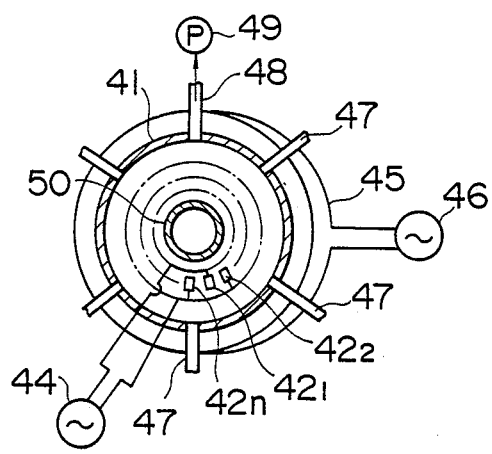

FIG. 4 shows a fourth embodiment of the present invention.

In this embodiment, a cylindrical base plate is disposed in a reaction vessel, a plurality of electrodes for discharge are radially arranged so as to surround the base plate, and each pair of adjacent electrodes is supplied with a glow discharge voltage. A plurality of reaction gas guide pipes are provided in the wall of the reaction vessel.

Thus, reference numeral 41 is a reaction vessel, numerals $42_1$, $42_2$ ... $42n$ are radially disposed electrodes, element 44 is a low-frequency power source (which may be replaced with a DC power source or a high-frequency power source) and is connected to the electrodes. Reference numeral 45 is a coil, numeral 46 is an AC power source, 47 is a reaction gas guide pipe, 48 is an exhaust vent, 49 is a vacuum pump and 50 is a cylindrical base plate.

As shown in FIG. 4, the base plate 50 is disposed in the circular region defined by the electrodes $42_1$ ... $42n$, and it confronts end portions of these electrodes so that the distances between the base plate and the end portions of the electrodes may be substantially uniform.

The other constitution and the principle of forming a thin film in this embodiment are identical with those of the preceding embodiments.

The cylindrical base plate 50 may be disposed so as to surround the electrodes $42_1$ to $42n$, though such an embodiment is not shown. According to this constitution, the amorphous thin film can be formed on the inside surface of the base plate.

In this embodiment, the coil 45 is disposed outside the reaction vessel 41 but may be arranged inside the vessel 41. Furthermore, the curve drawn by the end portions of the electrodes is not limited to being circular. For example, the electrodes may be constituted in order for their end portions to depict a semi-circular shape.

Figure 5:
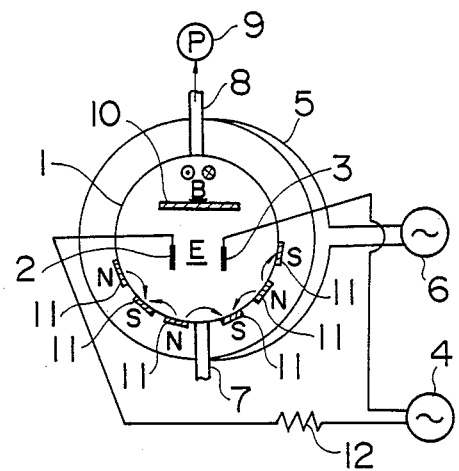

FIG. 5 shows a fifth embodiment of the present invention. This embodiment is similar to the first embodiment of FIG. 1, but permanent magnets are disposed at least partially along the wall surface of the reaction vessel, with the magnetic poles of the magnets being alternated.

That is, reference numeral 11 is a permanent magnet and numeral 12 is a discharge resistance. The permanent magnets are disposed on the outside surface of the reaction vessel so that magnetic poles of the adjacent magnets may be different from each other, i.e., so that the magnetic poles of the magnets may be arranged in a checkered form. The other constitution of this embodiment is identical with that of the first embodiment in FIG. 1, and the same numerals as in FIG. 1 are attached to the corresponding members. Accordingly, the explanation of these members is omitted.

The operation of this embodiment can be carried out in accordance with the same procedure as in the previous embodiments, but a plasma generated between the electrodes is confined in the reaction vessel 1 by the permanent magnets 11 attached on the outside surface of the reaction vessel 1 in order to prevent charged particles from combining with each other around the inside wall of the reaction vessel 1. As a result, a plasma density therein increases, and thus an increase in the generation ratio of radical partilces is enhanced.

The other constitutions of this embodiment and the principle of forming a thin film are identical with those of the previous embodiments.

Figure 6:
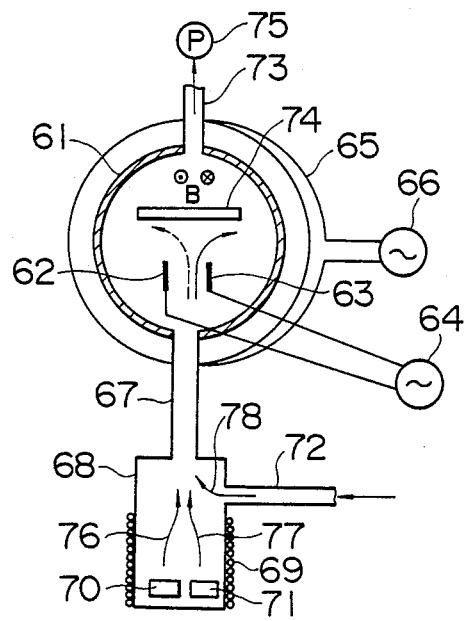
Figure 7:
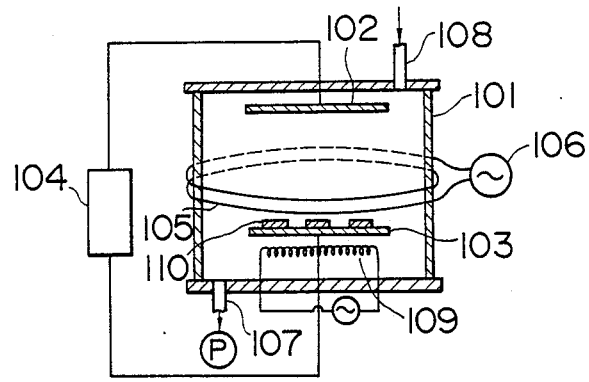
FIGS. 7 and 8 are cross-sectional side views showing conventional apparatus.
Figure 8:
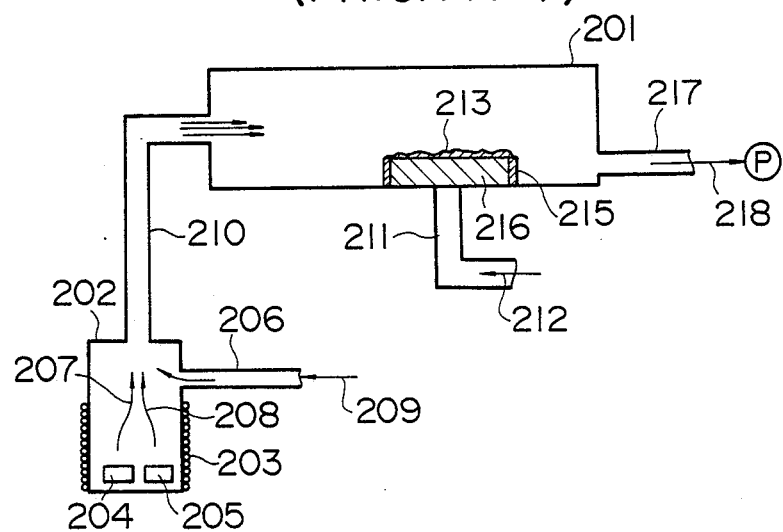

FIG. 6 shows a sixth embodiment of the present invention. This embodiment can solve the problems of the conventional method illustrated in FIG. 8.

This embodiment is a method for forming, on a base plate, film of a stabilized zirconia which has been made by dissolving a divalent or a trivalent metal in zirconia. In this method, an oxygen gas, a zirconium chloride vapor and a chloride vapor of a divalent or a trivalent metal are introduced into a reaction vessel, so that the oxygen gas and the chloride vapors are converted into ions and radicals by means of a glow discharge plasma generated in the reaction vessel, and the film of stabilized zirconia are then formed on the base plate.

This embodiment shown in FIG. 6 provides an apparatus for practicing the above mentioned method, and the apparatus is composed of a reaction vessel for receiving a base plate therein, a metal vapor feed device, leading to the reaction vessel, for introducing a zirconium chloride vapor and a chloride vapor of a divalent or a trivalent metal into the reaction vessel, a gas feed device for feeding an oxygen gas into the reaction vessel, electrodes for glow discharge disposed in the reaction vessel, a power source from which an electric power for discharge is fed to the electrodes, a coil surrounding the electrodes for discharge, for generating a magnetic field in a direction crossing at right angles to the electric field generated between the electrodes for discharge, and an AC power source from which the electric power for magnetic field generation is fed to the coil, whereby a stabilized zirconia film is formed on the base plate supported outside the range of the discharge electric field and in parallel with the direction of the discharge.

In this embodiment, the zirconium chloride vapor and the chloride vapor of the divalent or the trivalent metal are introduced into the reaction vessel receiving the base plate therein, as described above.

Further, in the reaction vessel, the glow discharge plasma is generated in order to convert the oxygen gas and the chloride vapors into ions and radicals.

Therefore, the stabilized zirconia film is formed on the base plate.

In this apparatus, the magnetic field is generated in a direction crossing at right angles to that of the discharge electric field between the electrodes for generating the glow discharge plasma in the reaction vessel, so that the oxygen gas and the chloride vapors are converted into the ions and the radicals. To such charged particles as the ions and the radicals, an initial velocity is given by the Coulomb force produced by the discharge electric field and the Lorentz force produced by the magnetic field, and the charged particles are drifted in the direction crossing the electric field at right angles. However, when these charged particles have left the electric field space, their Coulomb force weakens, and as a consequence the particles fly along a Larmor orbit by a cyclotron motion due to the Lorentz force, so that they fly about uniformly in the reaction vessel.

On the other hand, the radical particles which are electrically neutral deviate from the orbit of the charged particles and try to fly straightly, but they collide with the charged particles (particularly the ions), so that their course is corrected. In addition, this magnetic field is fluctuated, and therefore the radical particles also fly substantially, uniformly.

As a consequence, on the base plate supported outside the discharge electric field space and in parallel with the electric field, a uniform stabilized zirconia film is formed.

Now, the apparatus shown in FIG. 6 will be described.

In a reaction vessel 61, a pair of electrodes 62, 63 are disposed in parallel which are adapted to generate a glow discharge plasma. A low-frequency power source 64 makes use of a commercial frequency of, for example, 60 Hz and is connected to the pair of electrodes 62, 63. A coil 65 surrounds the reaction vessel 61 and is connected to an AC power source 66. A reaction gas guide pipe 67 is adapted to introduce undermentioned chlorides into the reaction vessel 61 therethrough.

An evaporator 68 is heated by a heater 69 and a temperature of its interior is maintained at a level of about 800 to about 1,200° C. Zirconium chloride 70 and yttrium chloride 71 are vaporized in the evaporator 68. A carrier gas guide pipe 72 leads to an oxygen gas source not shown and permits an oxygen gas 78 to be fed to the evaporator 68 therethrough. An exhaust vent 73 leads to a vacuum pump 75, and reference numeral 74 is a base plate on which a stabilized zirconium chloride film is formed.

Now, the operation of this embodiment shown in FIG. 6 will be bescribed.

A base plate 74 is supported by a suitable means in a direction crossing the surfaces of the pair of electrodes 62, 63 at right angles and outside a discharge space defined by the pair of electrodes 62, 63. After the vacuum pump 75 has been driven to evacuate the reaction vessel 61, a mixed gas of vapors 76 and 77 of the zircomium chloride 70 and the yttrium chloride 71 as well as the oxygen gas 78 is fed to the reaction vessel 61 through the reaction gas guide pipe 67.

In this case, the reaction vessel 61 is filled with the mixed gas so as to maintain a pressure therein at 0.05 to 0.5 Torr, and a voltage is then applied to the pair of electrodes 62, 63 from the low-frequency power source 64, so that a glow discharge plasma is generated between the pair of electrodes 62, 63.

On the other hand, an AC voltage of, for example, 100 Hz is applied to the coil 65, whereby a magnetic field B is generated in a direction crossing at right angles to an electric field E generated between the pair of electrodes 62, 63. With regard to the thus generated magnetic field B, a magnetic flux density of about 10 gauss suffices.

The gas fed through the reaction gas guide pipe 67 is converted into ions such as $Zr^{4+}$, $Y^{3+}$ and $O^{2-}$ as well as radicals such as $Zr^*$, $Y^*$ and $O^*$ by the glow discharge plasma generated between the pair of electrodes 62, 63, and these ions and radicals are deposited on the surface of the base plate 74 to form a thin film thereon.

At this time, charged particles such as $Zr^{4+}$, $Y^{3+}$ and $O^{2-}$ are brought into a so-called E×B drift motion between the pair of electrodes 62, 63 by the Coulomb force $F_1=qE$ due to the electric field E and the Lorentz force $F_2=q(v \times B)$ wherein the symbol v is a velocity of each charged particle.

That is, to the charged particles, an initial velocity is given by the E×B drift motion, and the charged particles are flied out in a direction crossing the surfaces of the electrodes 62, 63 at right angles toward the base plate 74. In a zone outside the discharge space, the charged particles are less affected by the electric field generated between the pair of electrodes 62, 63, and therefore they fly about along a Larmor orbit under the influence of a cyclotron motion due to the magnetic field B generated by the coil 65.

In consequence, charged particles such as $Zr^{4+}$, $Y^{3+}$, $O^{2-}$ and the like are transferred to the base plate 74 directly, so that the film of $(ZrO_2)(Y_2O_3)$ is formed thereon effectively.

On the other hand, the radical particles which are electrically neutral are not affected by the magnetic field B, and they thus derivate from the orbit of the charged particles and reach the base plate 74, thereby forming the film on the surface thereof. At this time, since the radical particles collide with the charged particles flying along the Larbor orbit, the amorphous thin film is formed on the base plate in the righthandedly and lefthandedly exteded range plus the range corresponding to the extent between the electrodes 62, 63. In addition, since the electric field B is fluctuated, it is possible to uniformly form the film on the surface of the base plate 74.

In this embodiment, reactions take place without an hydrogen atom (H), and therefore hydrochloric acid (HCl) is not produced in contast with the conventional technique. Accordingly, it is unnecessary to care about the anticorrosion of device members.

In this method, since the thin film is formed by a so-called plasma CVD, a rate of the film formation can be controlled, which fact makes it possible to form a solid electrolyte having a small resistance to the tranfer of an oxygen ion.

In this embodiment, yttrium chloride ($YCl_3$) is used as the chloride of the divalent or the trivalent metal, but ytterbium chloride ($YbCl_3$) and calcium chloride ($CaCl_3$) can also be employed to form stabilized zirconias $(ZrO_2)(Yb_2O_3)$ and $(ZrO_2)(CaO)$.

According to the present invention, uniform thin films such as the amorphous thin film and the stabilized zirconia film can be formed on either surface or both the surfaces of each base plate, or on the cylindrical or curved surfaces of the base plates, or on the base plates having a large area. Therefore, it is fair to say that the present invention is very valuable in industrial fields.

We claim:

1. An apparatus for forming a thin film which comprises a reaction vessel, a base plate disposed in said reaction vessel, means for reducing the pressure in said reaction vessel, means for introducing reaction gases to said reaction vessel, electrodes for discharge, disposed face to face in said reaction vessel, a power source connected to said electrodes for causing a glow discharge to said electrodes, a coil surrounding said electrodes for generating a magnetic field in a direction crossing at right angles to an electric field generated between said electrodes for discharge, and an AC power source from which a current for generating the magnetic field is fed to said coil, whereby said thin film is uniformly formed on said base plate by changing the magnetic field, said base plate being positioned outside the range of said discharge electric field and in parallel with the direction of said electric field.

2. The apparatus for forming a thin film according to claim 1 wherein the electrodes for discharge are prolonged in the direction of said magnetic field.

3. The apparatus for forming a thin film according to claim 1 or 2 wherein said base plate is tabular, and said electrodes for discharge are disposed in lines, with said base plate located between groups of said electrodes.

4. The apparatus for forming a thin film according to claim 1 or 2 wherein said base plate is cylindrical, and said electrodes for discharge are disposed so as to surround said base plate.

5. The apparatus for forming a thin film according to any one of claims 1 or 2 wherein permanent magnets are disposed to at least a partial extent on the wall surface of said reaction vessel, with the magnetic poles thereof being alternated.

6. The apparatus for forming a thin film according to claims 1 and 2 wherein said power source used to generate said magnetic field is a low-frequency power source.

7. The apparatus for forming a thin film according to any one of claims 1 and 2 wherein a monosilane gas is introduced into said reaction vessel whereby said thin film of amorphous silicon is formed.

8. The apparatus for forming a thin film according to any one of claims 1 and 2 wherein an oxygen gas, a zirconium chloride vapor and a chloride vapor of a divalent or a trivalent metal are introduced into said reaction vessel as said reaction gases, whereby said thin film of stabilized zirconia is formed.

9. The apparatus for forming a thin film according to claim 3 wherein permanent magnets are disposed to at least a partial extent on the wall surface of said reaction vessel, with the magnetic poles thereof being alternated.

10. An apparatus for forming a thin film according to claim 4 wherein permanent magnets are disposed in at least a partial extent on the wall surface of said reaction vessel, with magnetic poles thereof alternated.

11. The apparatus for forming a thin film according to claim 3 wherein said power source used to generate said magnetic field is a low-frequency power source.

12. An apparatus for forming a thin film according to claim 4 wherein said power source used to generate said magnetic field is a low-frequency power source.

13. The apparatus for forming a thin film according to claim 5 wherein said power source used to generate said magnetic field is a low-frequency power source.

14. The apparatus for forming a thin film according to claim 3 wherein a monosilane gas is introduced into said reaction vessel, whereby said thin film of amorphous silicon is formed.

15. An apparatus for forming a thin film according to claim 4 wherein a monosilane gas is fed by said means for permitting the pressure reduction in said reaction vessel and the feed of said reaction gases thereto, whereby said thin film of amorphous silicon is formed.

16. The apparatus for forming a thin film according to claim 5 wherein a monosilane gas is introduced into said reaction vessel, whereby said thin film of amorphous silicon is formed.

17. The apparatus for forming a thin film according to claim 6 wherein a monosilane gas is introduced into said reaction vessel, whereby said thin film of amorphous silicon is formed.

18. The apparatus for forming a thin film according to claim 3 wherein an oxygen gas, a zirconium chloride vapor and a chloride vapor of a divalent or a trivalent metal are introduced into said reaction vessel, whereby said thin film of stabilized zirconia is formed.

19. The apparatus for forming a thin film according to claim 4 wherein an oxygen gas, a zirconium chloride vapor and a chloride vapor of a divalent or a trivalent metal are introduced into said reaction vessel, whereby said thin film of stabilized zirconia is formed.

20. The apparatus for forming a thin film according to claim 5 wherein an oxygen gas, a zirconium chloride vapor and a chloride vapor of a divalent or a trivalent metal are introduced into said reaction vessel, whereby said thin film of stabilized zirconia is formed.

21. The apparatus for forming a thin film according to claim 6 wherein an oxygen gas, a zirconium chloride vapor and a chloride vapor of a divalent or a trivalent metal are introduced into said reaction vessel, whereby said thin film of stabilized zirconia is formed.

22. The apparatus of claim 1 wherein a plurality of pairs of discharge electrodes are disposed in said reaction vessel.

* * * * *